(12) United States Patent
Kim et al.

(10) Patent No.: US 11,448,694 B2
(45) Date of Patent: Sep. 20, 2022

(54) SEMICONDUCTOR PACKAGE TEST APPARATUS

(71) Applicant: SEMES CO., LTD., Cheonan-si (KR)

(72) Inventors: Eung Su Kim, Cheonan-si (KR); Chang Taek Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

(21) Appl. No.: 16/915,179

(22) Filed: Jun. 29, 2020

(65) Prior Publication Data
US 2021/0003631 A1 Jan. 7, 2021

(30) Foreign Application Priority Data
Jul. 2, 2019 (KR) .......................... 10-2019-0079180

(51) Int. Cl.
*G01R 31/28* (2006.01)

(52) U.S. Cl.
CPC ..... *G01R 31/2889* (2013.01); *G01R 31/2884* (2013.01); *G01R 31/2891* (2013.01); *G01R 31/2896* (2013.01)

(58) Field of Classification Search
CPC .............. G01R 31/28; G01R 31/2874; G01R 31/2884; G01R 31/2886; G01R 31/2889; G01R 31/2891; G01R 31/2893; G01R 31/2896; G01R 1/0433; G01R 1/0458; G01R 1/0466
See application file for complete search history.

(56) References Cited

U.S. PATENT DOCUMENTS

| 7,609,052 | B2 | 10/2009 | Mizushima et al. |
| 2004/0113646 | A1* | 6/2004 | Yamashita ......... G01R 31/2868 324/750.09 |
| 2009/0102497 | A1* | 4/2009 | Ito ..................... G01R 31/2887 324/757.01 |
| 2019/0128950 | A1* | 5/2019 | Mardi ................ G01R 1/0466 |

FOREIGN PATENT DOCUMENTS

| KR | 10-2008-0099322 | 11/2008 |
| KR | 10-2017-0056188 | 5/2017 |
| KR | 10-1877667 | 7/2018 |
| KR | 10-1936348 | 1/2019 |

OTHER PUBLICATIONS

Korean Office Action, with English translation, corresponding to Korean Application No. 10-2019-0079180, dated Jun. 16, 2020.

* cited by examiner

*Primary Examiner* — Jermele M Hollington
*Assistant Examiner* — Suresh K Rajaputra
(74) *Attorney, Agent, or Firm* — Kile Park Reed & Houtteman PLLC

(57) ABSTRACT

A semiconductor package test apparatus includes an interface board having connection terminals for electrically connecting a semiconductor package to a tester, a push block for pressing the semiconductor package toward the interface board to bring external terminals of the semiconductor package into contact with the connection terminals of the interface board, a temperature adjustment unit connected with the push block to heat or cool the semiconductor package to a test temperature through the push block, and a heat transfer member for thermally connecting the push block and the interface board.

13 Claims, 3 Drawing Sheets

SEMICONDUCTOR PACKAGE TEST APPARATUS

CROSS-REFERENCE TO RELATED APPLICATION

This application claims the priority benefit of Korean Patent Application No. 10-2019-0079180, filed on Jul. 2, 2019, and all the benefits accruing therefrom under 35 U.S.C. § 119, the contents of which are incorporated by reference in their entirety.

BACKGROUND

The present invention relates to a semiconductor package test apparatus. More specifically, the present invention relates to a semiconductor package test apparatus including an interface board and a push block used to connect a semiconductor package to a tester in order to electrically test the semiconductor package.

Generally, semiconductor devices may be formed on a silicon wafer used as a semiconductor substrate by repetitively performing a series of manufacturing processes. Semiconductor devices formed as described above may be manufactured into semiconductor packages through a dicing process and a packaging process.

The semiconductor packages may be electrically tested by using a test handler and a tester. The semiconductor packages may be received in insert members mounted on a test tray, and may be electrically connected to the tester through an interface board. The interface board may include socket boards electrically connected to the tester, test sockets disposed on the socket boards and connecting the semiconductor packages and the socket boards, and socket guides for aligning the semiconductor packages and the test sockets to each other. The insert members of the test tray may be brought into close contact with the socket guides, and the semiconductor packages may be brought into close contact with the test sockets by the push blocks.

The semiconductor packages may be heated or cooled to a predetermined test temperature. As an example, the test handler may include a test chamber in which the test process is performed, and a temperature in the test chamber may be maintained at the test temperature. That is, the temperature of the semiconductor packages and the interface board may be uniformly controlled in the test chamber.

Alternatively, temperature adjustment units may be connected to the push blocks to heat or cool the semiconductor packages to the test temperature. That is, the temperature of the semiconductor packages may be adjusted by the push blocks and the temperature adjustment units. In such case, since there is no separate temperature control means for the interface board, the time required for temperature control of the semiconductor packages may be relatively increased.

SUMMARY

The present invention provides a semiconductor package test apparatus capable of controlling a temperature of an interface board along with a temperature of a semiconductor package.

In accordance with an aspect of the present invention, a semiconductor package test apparatus may include an interface board having connection terminals for electrically connecting a semiconductor package to a tester, a push block for pressing the semiconductor package toward the interface board to bring external terminals of the semiconductor package into contact with the connection terminals of the interface board, a temperature adjustment unit connected with the push block to heat or cool the semiconductor package to a test temperature through the push block, and a heat transfer member for thermally connecting the push block and the interface board.

In accordance with some embodiments of the present invention, the semiconductor package test apparatus may further include an insert member having a pocket receiving the semiconductor package so that the external terminals of the semiconductor package are exposed toward the interface board, and a test tray disposed between the interface board and the push block and to which the insert member is mounted.

In accordance with some embodiments of the present invention, the heat transfer member may be configured to pass through the insert member and be brought into contact with the interface board.

In accordance with some embodiments of the present invention, the heat transfer member may include a first heat transfer member configured to pass through the insert member and be brought into contact with the interface board, and a second heat transfer member for connecting the push block with the first heat transfer member.

In accordance with some embodiments of the present invention, the push block may include a flange member connected with the temperature adjustment unit, and a pressing member extending from the flange member toward the interface board to pressurize the semiconductor package. The second heat transfer member may extend from the flange member toward the interface board and be brought into contact with the first heat transfer member.

In accordance with some embodiments of the present invention, the semiconductor package test apparatus may further include a match plate to which the push block is mounted.

In accordance with some embodiments of the present invention, the semiconductor package test apparatus may further include an insulating member for preventing heat transfer between the match plate and the push block.

In accordance with some embodiments of the present invention, the heat transfer member may include a first heat transfer member configured to pass through the insert member and be brought into contact with the interface board, and a second heat transfer member configured to pass through the insulating member and connect the push block with the first heat transfer member.

In accordance with some embodiments of the present invention, the push block may include a flange member connected with the temperature adjustment unit, and a pressing member extending from the flange member toward the interface board to pressurize the semiconductor package. The second heat transfer member may extend from the flange member toward the interface board and be brought into contact with the first heat transfer member.

In accordance with some embodiments of the present invention, the interface board may include a socket board electrically connected to the tester, a test socket disposed on the socket board and electrically connecting between the semiconductor package and the socket board, and a socket guide for aligning the test socket and the semiconductor package to each other.

In accordance with some embodiments of the present invention, the heat transfer member may be configured to be brought into contact with the socket guide.

In accordance with another aspect of the present invention, a semiconductor package test apparatus may include a tester providing signals for electrically testing a semiconductor package, an interface board having connection terminals for electrically connecting the semiconductor package to the tester, an insert member having a pocket receiving the semiconductor package so that external terminals of the semiconductor package are exposed toward the interface board, a test tray disposed adjacent to the interface board and to which the insert member is mounted, a push block for pressing the semiconductor package toward the interface board to bring the external terminals of the semiconductor package into contact with the connection terminals of the interface board, a temperature adjustment unit connected with the push block to heat or cool the semiconductor package to a test temperature through the push block, and a heat transfer member for thermally connecting the temperature adjustment unit and the interface board through the insert member.

In accordance with some embodiments of the present invention, the semiconductor package test apparatus may further include an insulating member to which the push block is mounted, a match plate to which the insulating member is mounted, and a driving unit for pushing the match plate so that the semiconductor package is connected to the interface board by the push block.

In accordance with some embodiments of the present invention, the push block may include a flange member disposed on one side of the insulating member, and a pressing member extending from the flange member toward the interface board through the insulating member to pressurize the semiconductor package.

In accordance with some embodiments of the present invention, the temperature adjustment unit may include a thermoelectric device disposed on one side of the flange member.

In accordance with some embodiments of the present invention, the heat transfer member may extend from the flange member toward the interface board passing through the insulating member and the insert member, and be brought into contact with the interface board.

In accordance with some embodiments of the present invention, the heat transfer member may include a first heat transfer member configured to pass through the insert member and be brought into contact with the interface board, and a second heat transfer member extending from the flange member toward the interface board passing through the insulating member to connect the flange member and the first heat transfer member.

In accordance with some embodiments of the present invention, the interface board may include a socket board electrically connected to the tester, a test socket disposed on the socket board and electrically connecting between the semiconductor package and the socket board, and a socket guide for aligning the test socket and the semiconductor package to each other.

In accordance with some embodiments of the present invention, the heat transfer member may be configured to be brought into contact with the socket guide.

In accordance with some embodiments of the present invention, the semiconductor package test apparatus may further include a first alignment pin extending from the insulating member toward the interface board, and a second alignment pin extending from the socket guide toward the first alignment pin. The insert member may have a first alignment hole into which the first alignment pin is inserted and a second alignment hole into which the second alignment pin is inserted, and the second alignment pin may have an alignment groove into which an end portion of the first alignment pin is inserted.

The above summary of the invention is not intended to describe each illustrated embodiment or every implementation of the present invention. The detailed description and claims that follow more particularly exemplify these embodiments.

BRIEF DESCRIPTION OF THE DRAWINGS

Embodiments of the present invention can be understood in more detail from the following description taken in conjunction with the accompanying drawings, in which.

Figure 1:
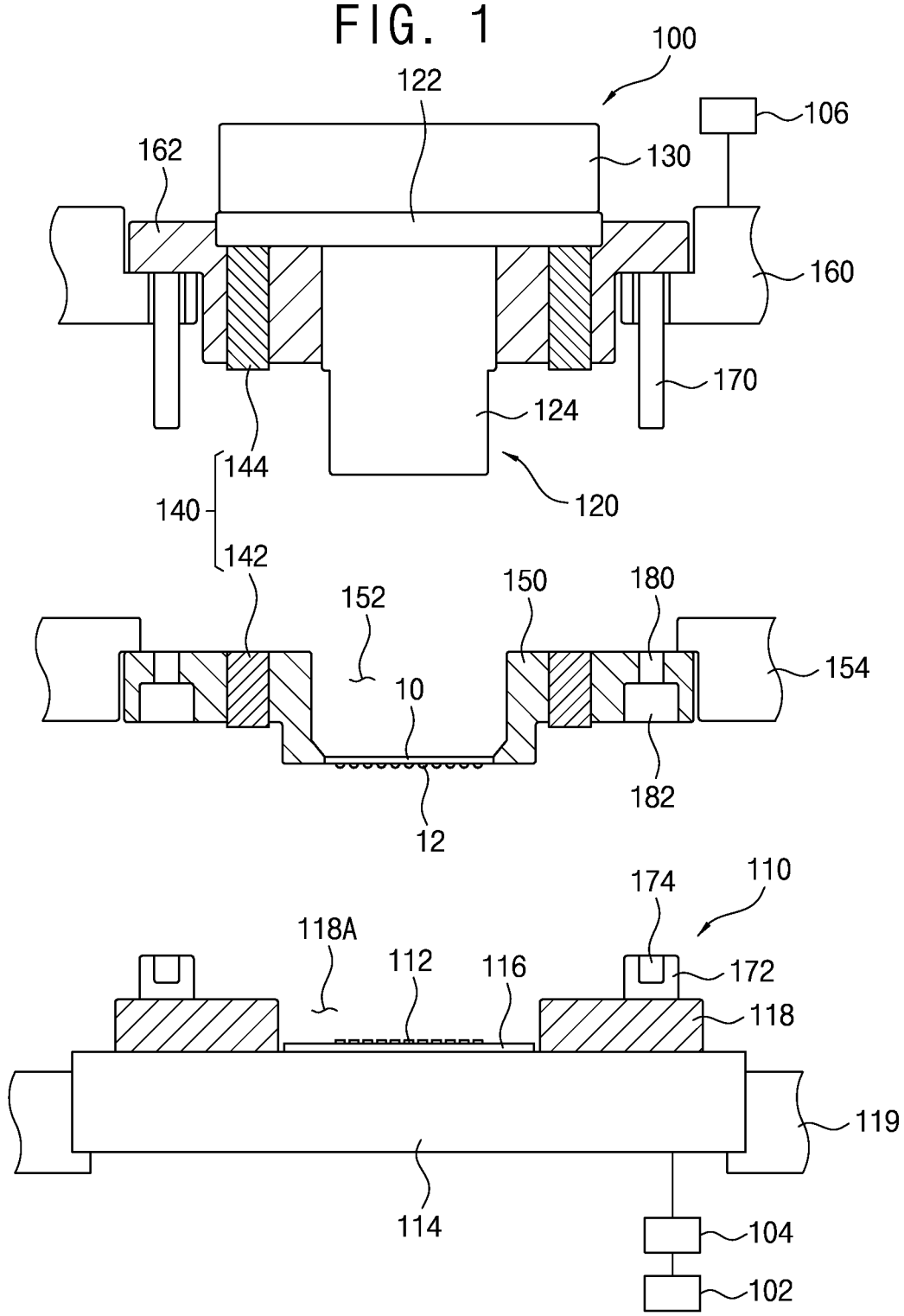
FIG. 1 is a schematic cross-sectional view illustrating a semiconductor package test apparatus in accordance with an embodiment of the present invention.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

Figure 2:
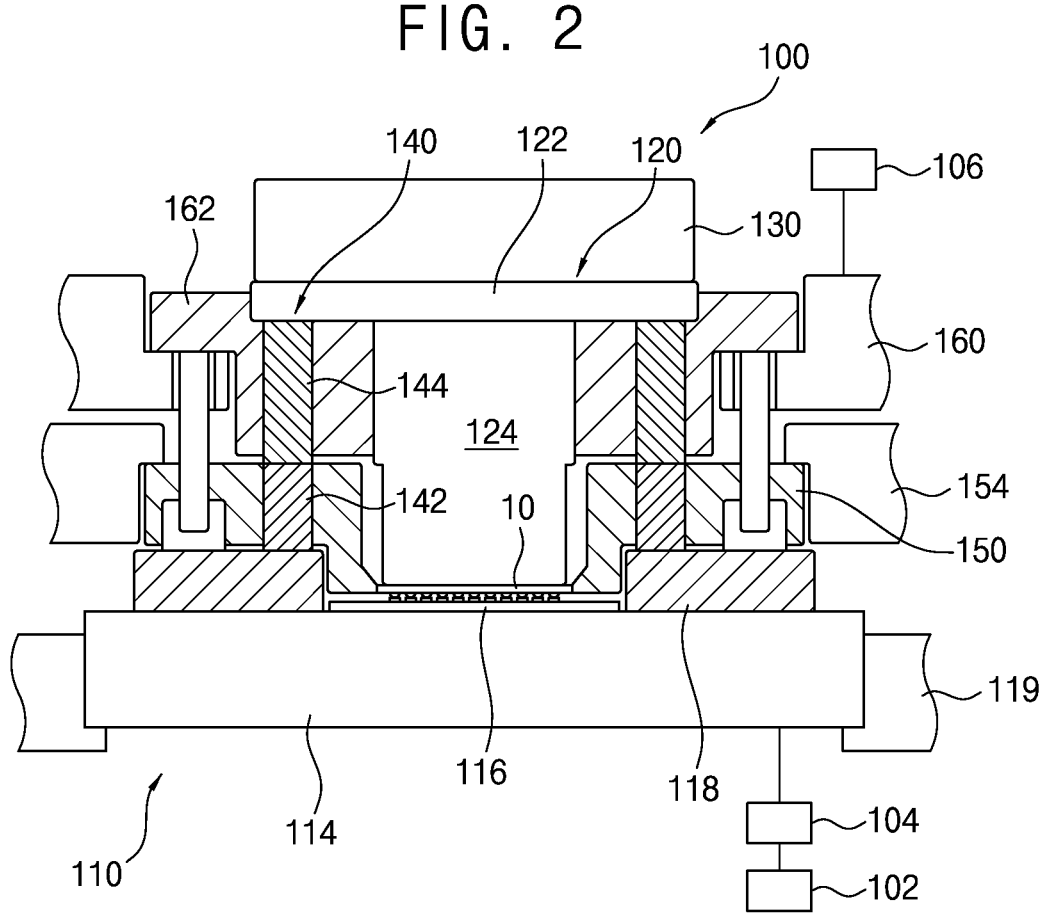
FIG. 2 is a schematic cross-sectional view illustrating a state in which elements of the semiconductor package test apparatus shown in FIG. 1 are coupled to each other.

FIG. 1 is a schematic view illustrating a semiconductor package test apparatus in accordance with an embodiment of the present invention, and FIG. 2 is a schematic cross-sectional view illustrating a state in which elements of the semiconductor package test apparatus shown in FIG. 1 are coupled to each other.

Referring to FIGS. 1 and 2, a semiconductor package test apparatus 100, in accordance with an embodiment of the present invention, may be used to electrically test a semiconductor package 10. Specifically, the semiconductor package test apparatus 100 may include a tester 102 providing signals for electrically testing a semiconductor package 10, an interface board 110 having connection terminals 112 for electrically connecting the semiconductor package 10 to the tester 102, a push block 120 for pressing the semiconductor package 10 toward the interface board 110 to bring external terminals 12 of the semiconductor package 10 into contact with the connection terminals 112 of the interface board 110, a temperature adjustment unit 130 connected with the push block 120 to heat or cool the semiconductor package 10 to a test temperature through the push block 120, and a heat transfer member 140 for thermally connecting the push block 120 and the interface board 110.

The tester 102 may provide signals for electrically testing the semiconductor package 10, and may analyze output signals from the semiconductor package 10 to check the electrical performance of the semiconductor package 10. The tester 102 may include a test board 104 for providing the signals to the semiconductor package 10 and receiving the output signals from the semiconductor package 10. The test board 104 may be electrically connected with the interface board 110.

The interface board 110 may include a socket board 114 electrically connected to the test board 104 of the tester 102, a test socket 116 disposed on the socket board 114 and electrically connecting between the semiconductor package 10 and the socket board 114, and a socket guide 118 for aligning the test socket 116 and the semiconductor package 10 to each other. The socket guide 118 may have an opening 118A exposing the test socket 116, and may be fixed to the socket board 114 by a plurality of fastening bolts (not shown). The test socket 116 may include connection terminals 112 for connecting with the external terminals 12 of the semiconductor package 10 and may be disposed in the opening 118A of the socket guide 118.

The interface board 110 may include a frame 119 to which the socket board 114 is mounted. As shown in FIG. 1, although one socket board 114 is mounted on the frame 119, a plurality of socket boards 114 may be mounted on the frame 119 so that a plurality of semiconductor packages 10 can be electrically and simultaneously tested.

The semiconductor package test apparatus 100 may include an insert member 150 having a pocket 152 receiving the semiconductor package 10 so that the external terminals 12 of the semiconductor package 10 are exposed toward the interface board 110, and a test tray 154 disposed adjacent to the interface board 110 and to which the insert member 150 is mounted. As shown in FIG. 1, although one insert member 150 is mounted on the test tray 154, a plurality of insert members 150 may be mounted on the test tray 154 so that a plurality of semiconductor packages 10 can be electrically and simultaneously tested.

The semiconductor package test apparatus 100 may include a match plate 160 disposed adjacent to the test tray 154 and on which the push block 120 is mounted. For example, an insulating member 162 for preventing heat transfer from the push block 120 to the match plate 160 may be mounted to the match plate 160, and the push block 120 may be mounted to the insulating member 162. For example, the insulating member 162 may be configured to surround the push block 120, and may be made of a material having a relatively low thermal conductivity, for example, plastic or synthetic resin. The push block 120 may be made of a material having a relatively high thermal conductivity, for example, aluminum or copper.

The push block 120 may include a flange member 122 connected with the temperature adjustment unit 130, and a pressing member 124 extending from the flange member 122 toward the interface board 110 to pressurize the semiconductor package 10. The temperature adjustment unit 130 may include a thermoelectric device. Though not shown in figures, heat transfer fins or heat sinks for dissipating or absorbing heat may be connected to the thermoelectric device. The flange member 122 may be disposed on one side of the insulating member 162, and the temperature adjustment unit 130 may be disposed on one side of the flange member 122. As shown in FIG. 1, although one push block 120 and one temperature adjustment unit 130 are mounted on the match plate 160, a plurality of push blocks 120 and a plurality of temperature adjustment units 130 may be mounted on the match plate 160 so that a plurality of semiconductor packages 10 can be electrically and simultaneously tested.

Though not shown in figures, the semiconductor package test apparatus 100 may include a load unit for transferring a plurality of semiconductor packages 10 from a customer tray to a plurality of insert members 150 mounted on the test tray 154, an unload unit for transferring the semiconductor packages 10 from the test tray 154 to a customer tray after performing the test process, a tray transfer unit for transferring the test tray 154 from the load unit between the interface board 110 and the match plate 160 and transferring the test tray 154 to the unload unit after performing the test process, and a driving unit 106 for pushing the match plate 160 such that the semiconductor packages 10 are connected to the interface board 110 by the push blocks 120. Particularly, a pocket portion of the insert member 150 may be inserted into the opening 118A of the socket guide 118 by the driving unit 106, and the semiconductor package 10 may be connected with the test socket 116 by the push block 120.

In accordance with an embodiment of the present invention, the heat transfer member 140 may be brought into contact with the interface board 110 through the insulating member 162 and the insert member 150. For example, the heat transfer member 140 may include a first heat transfer member 142 configured to pass through the insert member 150 and be brought into contact with the interface board 110, and a second heat transfer member 144 for connecting the push block 120 with the first heat transfer member 142. The second heat transfer member 144 may extend from the flange member 122 toward the interface board 110 and may be connected with the first heat transfer member 142. Particularly, the heat transfer member 140 may thermally connect the flange member 122 of the push block 120 with the socket guide 118 of the interface board 110, and may be made of a material having a relatively high thermal conductivity, for example, aluminum or copper.

Figure 3:
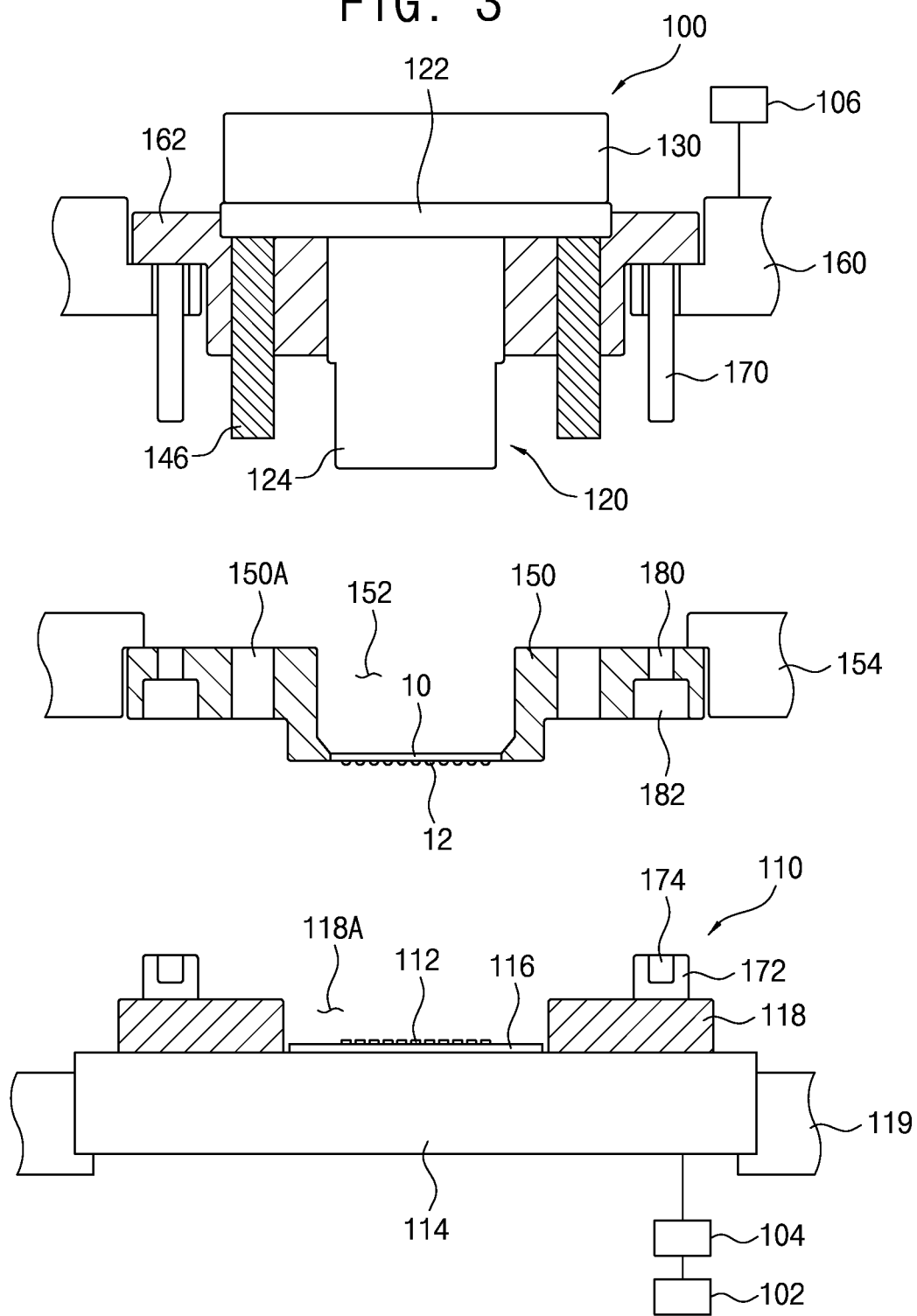
FIG. 3 is a schematic cross-sectional view illustrating another example of a heat transfer member as shown in FIG. 1.

FIG. 3 is a schematic view illustrating another example of the heat transfer member as shown in FIG. 1.

Referring to FIG. 3, a heat transfer member 146 may be formed in one piece. For example, the heat transfer member 146 may extend from the flange member 122 toward the interface board 110 through the insulating member 162, and the insert member 150 may have a through hole 150A configured so that the heat transfer member 146 is inserted. That is, the heat transfer member 146 may be brought into contact with the socket guide 118 of the interface board 110 through the through hole 150A of the insert member 150.

Referring again to FIGS. 1 and 2, the semiconductor package test apparatus 100 may include a first alignment pin 170 and a second alignment pin 172 for aligning the semiconductor package 10 with the test socket 116. The first alignment pin 170 may extend from the insulating member 162 toward the interface board 110, and the second alignment pin 172 may extend from the socket guide 118 toward the first alignment pin 170. The insert member 150 may have a first alignment hole 180 into which the first alignment pin 170 is inserted and a second alignment hole 182 into which the second alignment pin 172 is inserted. The first alignment hole 180 may be coaxially formed with the second alignment hole 182, and the second alignment pin 172 may have an alignment groove 174 into which an end portion of the first alignment pin 170 is inserted.

In accordance with the embodiments of the present invention, the temperature of the semiconductor package 10 may be adjusted by the push block 120 and the temperature adjustment unit 130. The temperature of the interface board 110 may be adjusted by the heat transfer member 140 extending from the flange member 122 of the push block 120. That is, the temperature of the interface board 110 may be controlled at the same time as the semiconductor package 10 and at the same temperature as the semiconductor package 10. Accordingly, the time required to control the temperature of the semiconductor package 10 may be significantly shortened. Further, the temperature of the semiconductor package 10 may be more precisely controlled, and thus, the test reliability of the semiconductor package 10 may be greatly improved.

Although the semiconductor package test apparatus 100 has been described with reference to specific embodiments, it is not limited thereto. Therefore, it will be readily understood by those skilled in the art that various modifications and changes can be made thereto without departing from the spirit and scope of the present invention defined by the appended claims.

The invention claimed is:

1. A semiconductor package test apparatus comprising:
  a push block configured to press semiconductor package toward an interface board for electrically connecting the semiconductor device package to a tester to bring external terminals of the semiconductor package into contact with connection terminals of the interface board;
  an insert member having a pocket receiving the semiconductor package so that the external terminals of the semiconductor package are exposed toward the interface board;
  a test tray disposed between the interface board and the push block and to which the insert member is mounted;
  a temperature adjustment unit disposed on the push block to heat or cool the semiconductor package to a test temperature through the push block; and
  a heat transfer member configured to directly connect the push block and the interface board to heat or cool the interface board, wherein
  the push block comprises a flange member, and a pressing member extending from the flange member toward the interface board to pressurize the semiconductor package,
  the heat transfer member comprises a first heat transfer member configured to pass through the insert member and be brought into contact with the interface board, and a second heat transfer member for connecting the flange member with the first heat transfer member,
  the temperature adjustment unit is disposed on the flange member, and
  the heat transfer member directly connects the flange member and the interface board in order to transfer heat between the temperature adjustment unit and the interface board through the flange member and the heat transfer member.

2. The semiconductor package test apparatus of claim 1, wherein the second heat transfer member extends from the flange member toward the interface board and is brought into contact with the first heat transfer member.

3. The semiconductor package test apparatus of claim 1, further comprising a match plate to which the push block is mounted.

4. The semiconductor package test apparatus of claim 3, further comprising an insulating member for preventing heat transfer between the match plate and the push block.

5. The semiconductor package test apparatus of claim 4, wherein the second heat transfer member passes through the insulating member and connects the flange member with the first heat transfer member.

6. The semiconductor package test apparatus of claim 1, wherein the interface board comprises:
  a socket board electrically connected to the tester;
  a test socket disposed on the socket board and electrically connecting between the semiconductor package and the socket board; and
  a socket guide for aligning the test socket and the semiconductor package to each other.

7. The semiconductor package test apparatus of claim 6, wherein the heat transfer member is configured to be brought into contact with the socket guide.

8. A semiconductor package test apparatus comprising:
  a push block configured to press a semiconductor package toward an interface board for electrically connecting the semiconductor package to a tester to bring external terminals of the semiconductor package into contact with connection terminals of the interface board;
  an insulating member to which the push block is mounted;
  a match plate to which the insulating member is mounted;
  a driving unit for pushing the match plate so that the semiconductor package is connected to the interface board by the push block;
  an insert member having a pocket receiving the semiconductor package so that external terminals of the semiconductor package are exposed toward the interface board;
  a test tray disposed adjacent to the interface board and to which the insert member is mounted;
  a temperature adjustment unit disposed on the push block to heat or cool the semiconductor package to a test temperature through the push block; and
  a heat transfer member configured to directly connect the push block and the interface board through the insert member to heat or cool the interface board, wherein
  the push block comprises a flange member disposed the insulating member, and a pressing member extending from the flange member toward the interface board through the insulating member to pressurize the semiconductor package, the temperature adjustment unit is disposed on the flange member, and the heat transfer member extends from the flange member toward the interface board passing through the insulating member and the insert member and is brought into contact with the interface board in order to transfer heat between the temperature adjustment unit and the interface board through the flange member and the heat transfer member.

9. The semiconductor package test apparatus of claim 8, wherein the temperature adjustment unit comprises a thermoelectric device disposed on one side of the flange member.

10. The semiconductor package test apparatus of claim 8, wherein the heat transfer member comprises:
   a first heat transfer member configured to pass through the insert member and be brought into contact with the interface board; and
   a second heat transfer member extending from the flange member toward the interface board passing through the insulating member to connect the flange member and the first heat transfer member.

11. The semiconductor package test apparatus of claim 8, wherein the interface board comprises:
   a socket board electrically connected to the tester;
   a test socket disposed on the socket board and electrically connecting between the semiconductor package and the socket board; and
   a socket guide for aligning the test socket and the semiconductor package to each other.

12. The semiconductor package test apparatus of claim 11, wherein
   the heat transfer member is configured to be brought into contact with the socket guide.

13. The semiconductor package test apparatus of claim 11, further comprising:
   a first alignment pin extending from the insulating member toward the interface board; and
   a second alignment pin extending from the socket guide toward the first alignment pin,
   wherein the insert member has a first alignment hole into which the first alignment pin is inserted and a second alignment hole into which the second alignment pin is inserted, and the second alignment pin has an alignment groove into which an end portion of the first alignment pin is inserted.

* * * * *